US012731927B2

(12) United States Patent
Ashibu

(10) Patent No.: US 12,731,927 B2
(45) Date of Patent: Sep. 8, 2026

(54) CONNECTOR, CONNECTOR ASSEMBLY, AND WEARING ARTICLE

(71) Applicant: Japan Aviation Electronics Industry, Limited, Tokyo (JP)

(72) Inventor: Kenta Ashibu, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 365 days.

(21) Appl. No.: 18/583,023

(22) Filed: Feb. 21, 2024

(65) Prior Publication Data

US 2024/0388026 A1 Nov. 21, 2024

(30) Foreign Application Priority Data

May 18, 2023 (JP) ................................ 2023-082241

(51) Int. Cl.
*H01R 12/77* (2011.01)
*H05K 1/11* (2006.01)

(52) U.S. Cl.
CPC .......... *H01R 12/777* (2013.01); *H05K 1/118* (2013.01)

(58) Field of Classification Search
CPC .... H01R 12/777; H01R 12/592; H01R 13/02; H01R 13/33; H01R 13/40; H01R 13/73; H05K 1/118; H05K 1/189; A41D 1/005
See application file for complete search history.

(56) References Cited

U.S. PATENT DOCUMENTS

| | | | | |
|---|---|---|---|---|
| 2021/0021069 A1* | 1/2021 | Komoto | ................ | H01R 12/69 |
| 2021/0098914 A1* | 4/2021 | Hashiguchi | .......... | H01R 12/778 |
| 2023/0420902 A1* | 12/2023 | Kimura | ................ | H01R 12/592 |
| 2024/0178604 A1* | 5/2024 | Nakamura | ........... | H01R 12/592 |
| 2024/0222893 A1* | 7/2024 | Hashiguchi | ............ | H01R 13/05 |
| 2024/0388026 A1* | 11/2024 | Ashibu | ................ | H01R 12/592 |
| 2024/0388027 A1* | 11/2024 | Ashibu | ................ | H05K 1/0283 |
| 2025/0055216 A1* | 2/2025 | Matsuo | ................ | H01R 13/052 |
| 2025/0141140 A1* | 5/2025 | Komoto | ............... | H01R 13/005 |
| 2025/0279607 A1* | 9/2025 | Matsuo | .................. | H01R 12/69 |

FOREIGN PATENT DOCUMENTS

JP 2019123959 A 7/2019

* cited by examiner

*Primary Examiner* — Abdullah A Riyami
*Assistant Examiner* — Nader J Alhawamdeh
(74) *Attorney, Agent, or Firm* — MUNCY, GEISSLER, OLDS & LOWE, P.C.

(57) ABSTRACT

A connector includes a first contact and a second contact spaced from each other, and a first sheet member that has flexibility and an insulating property and is stretchable, a base end of the first sheet member being configured to be mounted on a mounting object at a position opposite from the second contact with respect to the first contact, a distal end of the first sheet member having the first contact retained therein, the second contact being configured to be retained by the mounting object via a flexible second sheet member or directly retained by the mounting object, with at least the first sheet member being elastically stretched, the connector being fitted to the counter connector, the first contact and the second contact being electrically connected to the counter first contact and the counter second contact due to a shrinking force generated at the first sheet member.

21 Claims, 10 Drawing Sheets

CONNECTOR, CONNECTOR ASSEMBLY, AND WEARING ARTICLE

BACKGROUND OF THE INVENTION

The present invention relates to a connector, particularly to a connector mounted on a mounting object such as a garment and fitted to a counter connector.

The present invention also relates to a connector assembly composed of such a connector and a counter connector.

The present invention also relates to a wearing article as a mounting object on which a connector is mounted.

In recent years, attention has been drawn to so-called smart clothes that can obtain user's biological data such as the heart rate and the body temperature only by being worn by the user. Such smart clothes have an electrode disposed at a measurement site, and when a wearable device serving as a measurement device is electrically connected to the electrode, biological data can be transmitted to the wearable device.

The electrode and the wearable device can be interconnected by, for instance, use of a connector connected to a wiring portion drawn from the electrode.

In the smart clothes as above, the electrode needs to be closely attached to the body of the user to acquire the user's biological data with high accuracy.

To cope with it, for example, JP 2019-123959 A discloses a garment to which a tightening device is attached as shown in FIGS. 25 and 26. The tightening device includes: a band type self-adherent tape 2 attached to each of the right and left lateral portions on the outer side of a front body 1 of the garment as shown in FIG. 25; and sheet type self-adherent tapes 4 and 5 attached to each of the right and left lateral portions on the outer side of a back body 3 of the garment as shown in FIG. 26.

Although not shown, electrodes are disposed on the inner side of the front body 1. When the band type self-adherent tapes 2 of the front body 1 are, while being pulled, connected to the self-adherent tapes 4 or 5 of the back body 3, the garment is tightened so that the electrodes can be closely attached to the body of the user.

However, in the garment to which the tightening device of JP 2019-123959 A is attached, it is necessary to further mount a circuit module, a connector, and other components on the garment and electrically connect them to the electrodes in order to measure biological data acquired through the electrodes or transmit such data to a remote measurement device. Thus, another operation is required to electrically connect the electrodes to the circuit module, the connector, and other components, in addition to tightening operation of the garment using the tightening device.

SUMMARY OF THE INVENTION

The present invention has been made to solve the conventional problem as above and aims at providing a connector that is mounted on a mounting object and is capable of both tightening of the mounting object and establishment of electric connection only by being fitted to a counter connector.

The present invention also aims at providing a connector assembly composed of the connector and a counter connector.

The present invention also aims at providing a wearing article on which the connector is mounted.

A connector according to the present invention is one that is configured to be mounted on a mounting object and fitted to a counter connector in which a counter first contact and a counter second contact are retained by a housing having rigidity and an insulating property, the connector comprising:

a first contact and a second contact that are spaced from each other in a predetermined direction and are configured to be respectively fitted to the counter first contact and the counter second contact when the connector is fitted to the counter connector; and a first sheet member that has flexibility and an insulating property and is stretchable at least in the predetermined direction, a base end of the first sheet member in the predetermined direction being mounted on the mounting object at a position opposite from the second contact with respect to the first contact, and a distal end of the first sheet member in the predetermined direction having the first contact retained therein, wherein the second contact is configured to be retained by the mounting object via a second sheet member having flexibility and an insulating property or directly retained by the mounting object, and with at least the first sheet member being elastically stretched in the predetermined direction, the connector is fitted to the counter connector, and due to a shrinking force generated at the first sheet member, the first contact and the second contact are electrically connected to the counter first contact and the counter second contact, respectively.

A connector assembly according to the present invention comprises:

the foregoing connector; and the counter connector to which the connector is fitted.

A wearing article according to the present invention serves as the mounting object on which the foregoing connector is mounted.

DETAILED DESCRIPTION OF THE INVENTION

Embodiments of the present invention are described below based on the accompanying drawings.

Embodiment 1

Figure 1:
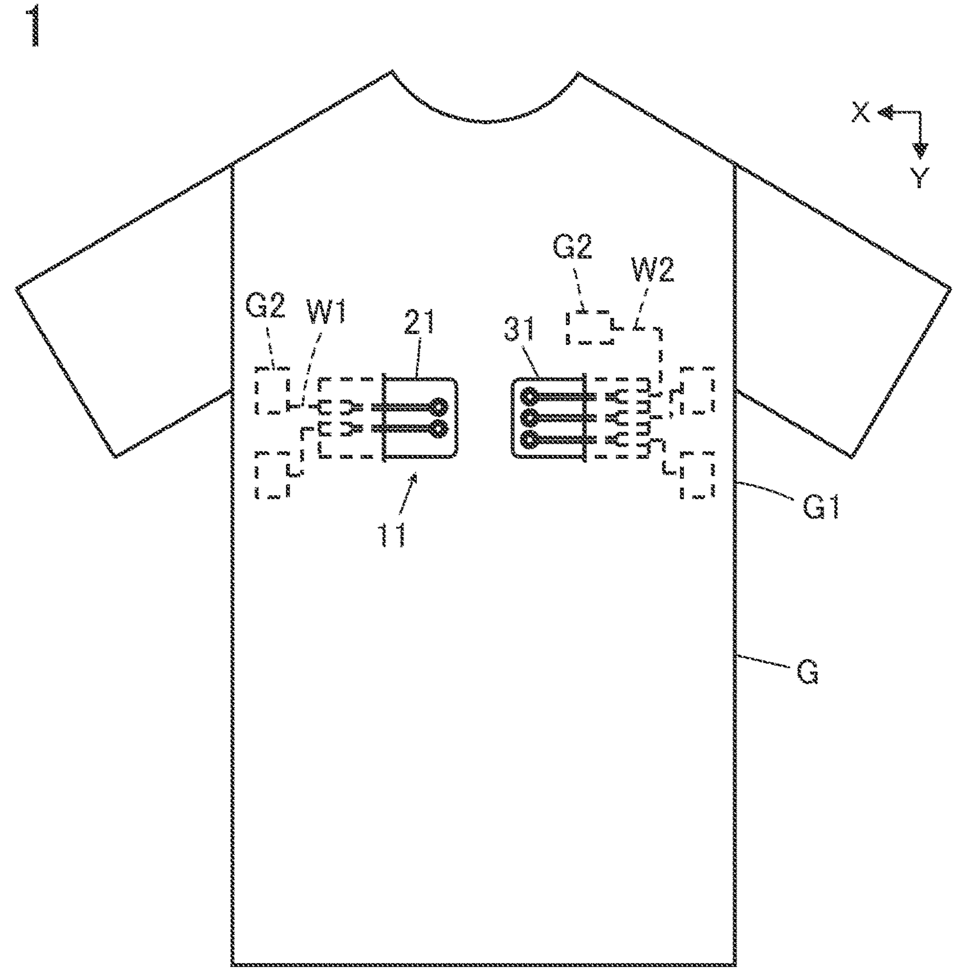
FIG. 1 is a view showing a garment on which a connector according to Embodiment 1 is mounted.

FIG. 1 shows a garment G on which a connector 11 according to Embodiment 1 is attached. The garment G is a top such as a shirt worn by a user. The connector 11 used as a garment-side connector is disposed on a tubular circumferential portion G1 constituted of a body part in which a torso of a user is inserted.

The connector 11 is attached to a front body of the garment G and is composed of a first connector member 21 and a second connector member 31 that are spaced from each other at an interval in the circumferential direction of the circumferential portion G1.

A plurality of electrodes G2 constituting terminal members are attached on an inner peripheral surface of the circumferential portion G1 of the garment G, that is, the inner surface of the garment G that faces the body of the user when the user wears the garment G.

In addition, a plurality of first wiring portions W1 and a plurality of second wiring portions W2 are respectively disposed between electrodes G2 and the first connector member 21 and between electrodes G2 and the second connector member 31 on the inner peripheral surface of the circumferential portion G1. Specifically, of the electrodes G2, some are connected to the first connector member 21 via the first wiring portions W1 and the others are connected to the second connector member 31 via the second wiring portions W2.

For convenience, the front body of the garment G in FIG. 1 is defined as extending along an XY plane, the first connector member 21 and the second connector member 31 are defined as being spaced in an X direction, and the direction that is perpendicular to an XY plane and is directed from the front body toward the front of the garment G is defined as a +Z direction.

The second connector member 31 is disposed on the −X direction side of the first connector member 21 when the garment G is seen from the front.

Figure 2:
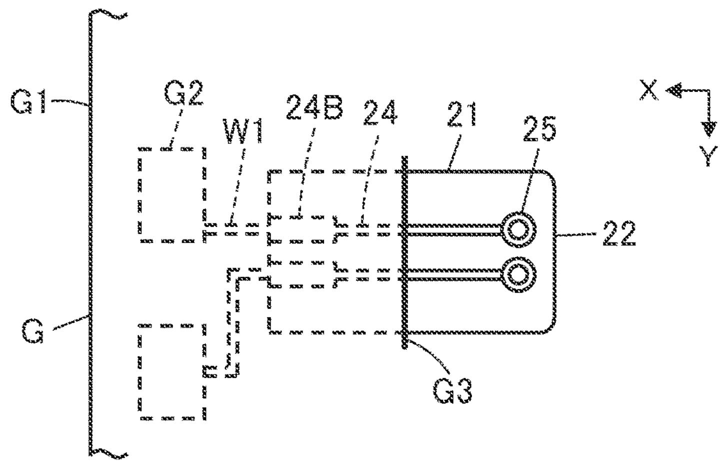
FIG. 2 is a view showing a first connector member of the connector according to Embodiment 1 mounted on the garment.

As shown in FIG. 2, the first connector member 21 includes an insulating first sheet member 22 extending from the +X direction toward the −X direction along an XY plane. The circumferential portion G1 of the garment G is provided with a slit G3 corresponding to the first connector member 21 and extending in the Y direction. By passing the first sheet member 22 through the slit G3, the +X directional portion of the first connector member 21 is placed on the inner peripheral surface side of the circumferential portion G1 of the garment G, while the −X directional portion of the first connector member 21 is placed on the outer peripheral surface side of the circumferential portion G1 of the garment G.

Figure 3:
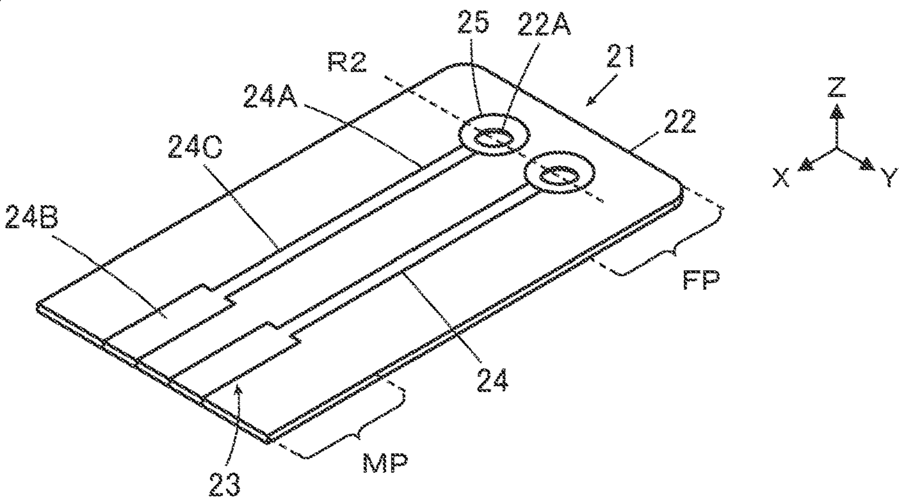
FIG. 3 is a perspective view showing the first connector member used in Embodiment 1.

As shown in FIG. 3, the first sheet member 22 extending from the +X direction toward the −X direction includes: a mounting portion MP that is defined at a base end of the first sheet member 22 on the +X direction side and is to be mounted on the garment G; and a fitting portion FP that is defined at a distal end of the first sheet member 22 on the −X direction side and is to be fitted to a counter connector 12.

The first sheet member 22 is provided with an embroidery pattern 23 made by sewing an embroidery thread. The embroidery pattern 23 extends from the mounting portion MP to the fitting portion FP. A conductive thread is used as the embroidery thread forming the embroidery pattern 23, so that a plurality of first flexible conductors 24 having electric conductivity are formed.

Each first flexible conductor 24 includes: a linear first connection portion 24A disposed in the fitting portion FP of the first sheet member 22 and extending in the X direction; a rectangular second connection portion 24B disposed in the mounting portion MP of the first sheet member 22; and a joint portion 24C joining the first connection portion 24A and the second connection portion 24B to each other in the X direction.

The first connector member 21 includes a plurality of first contacts 25 attached to the fitting portion FP of the first sheet member 22 and electrically connected to the first connection portions 24A of the first flexible conductors 24. The first contacts 25 are aligned in the Y direction in the fitting portion FP to form a contact row R2 extending in the Y direction.

Each first contact 25 is a conductive member having a ring shape, more specifically, a donut shape, made of metal or the like, and is attached to a peripheral portion of a sheet through hole 22A that is formed in the first sheet member 22 in a place where the first connection portion 24A of the corresponding first flexible conductor 24 is disposed. For the first contact 25, a ring-shaped metal fitting called a grommet may be used, for instance.

Figure 4:
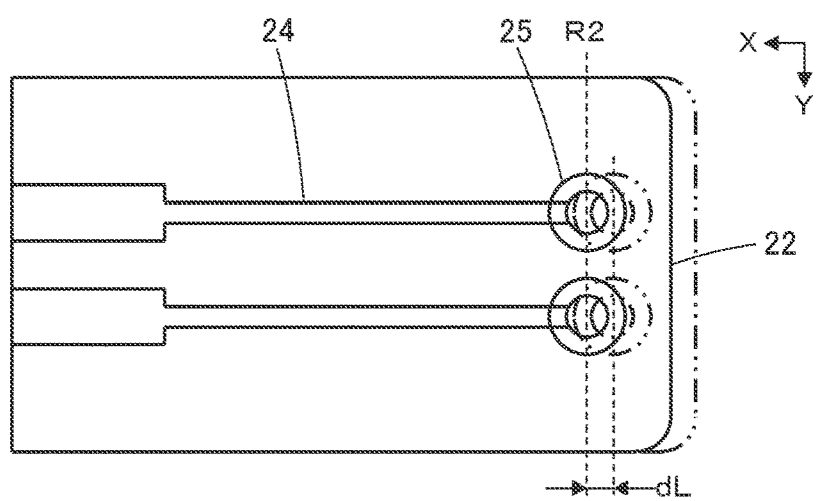
FIG. 4 is a plan view showing the first connector member used in Embodiment 1.

The first sheet member 22 is made of, for example, insulating cloth, knitted fabric, or rubber material and is a flexible member that is stretchable at least in the X direction. The first contacts 25 situated in the contact row R2 can be displaced in the −X direction when a tensile force in the −X direction is exerted on the distal end of the first sheet member 22 on the −X direction side, as illustrated by the two-dot-dash line in FIG. 4. An amount of displacement dL of the first contacts 25 varies depending on the tensile force acting on the first sheet member 22, and a shrinking force according to the amount of displacement dL is generated at the first sheet member 22 elastically stretched in the X direction.

Since the first flexible conductors 24 are made of the embroidery thread, the first flexible conductors 24 extending in the X direction are also configured to be stretchable in the X direction.

As shown in FIG. 2, the base end of the first connector member 21 on the +X direction side is situated on the inner peripheral surface side of the circumferential portion G1 of the garment G. The second connection portions 24B of the first flexible conductors 24 are electrically connected to the corresponding first wiring portions W1 and further to the corresponding electrodes G2 via the first wiring portions W1 on the inner peripheral surface side of the circumferential portion G1.

The distal end of the first connector member 21 on the −X direction side is situated on the outer peripheral surface side of the circumferential portion G1 of the garment G, so that the first contacts 25 are exposed on the outer peripheral surface side of the circumferential portion G1.

Figure 5:
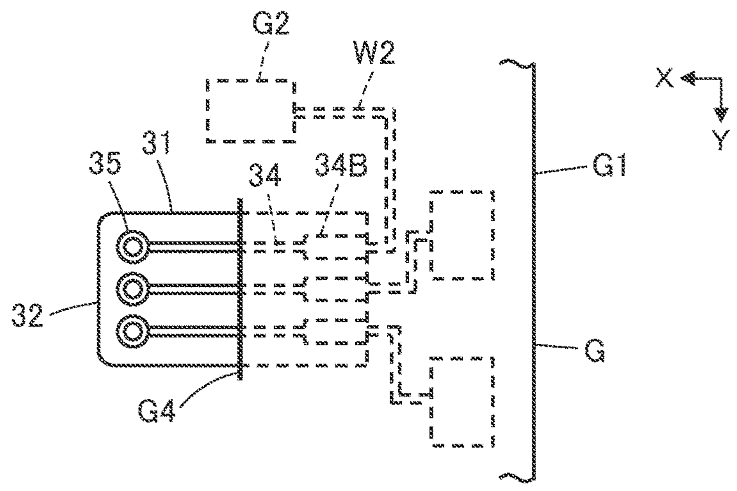
FIG. 5 is a view showing a second connector member of the connector according to Embodiment 1 mounted on the garment.

As shown in FIG. 5, the second connector member 31 includes an insulating second sheet member 32 extending from the −X direction toward the +X direction along an XY plane. The circumferential portion G1 of the garment G is provided with a slit G4 corresponding to the second connector member 31 and extending in the Y direction. By passing the second sheet member 32 through the slit G4, the −X directional portion of the second connector member 31 is placed on the inner peripheral surface side of the circumferential portion G1 of the garment G, while the +X directional portion of the second connector member 31 is placed on the outer peripheral surface side of the circumferential portion G1 of the garment G.

Figure 6:
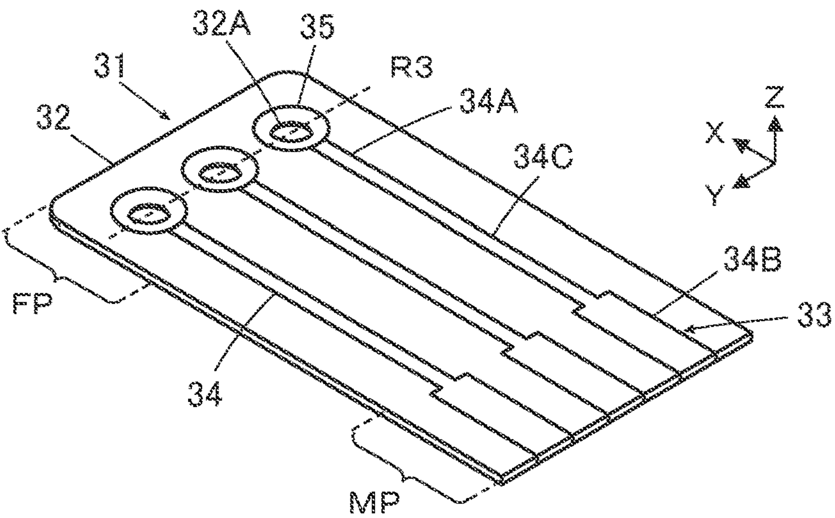
FIG. 6 is a perspective view showing the second connector member used in Embodiment 1.

The second connector member 31 has a configuration similar to the first connector member 21. To be more specific, as shown in FIG. 6, the second sheet member 32 extending from the −X direction toward the +X direction includes: a mounting portion MP that is defined at a base end of the second sheet member 32 on the −X direction side and is to be mounted on the garment G; and a fitting portion FP that is defined at a distal end of the second sheet member 32 on the +X direction side and is to be fitted to the counter connector 12.

The second sheet member 32 is provided with an embroidery pattern 33 made by sewing an embroidery thread, and a plurality of second flexible conductors 34 having electric conductivity are formed by the embroidery pattern 33.

Each second flexible conductor 34 includes: a linear first connection portion 34A disposed in the fitting portion FP of the second sheet member 32 and extending in the X direction; a rectangular second connection portion 34B disposed in the mounting portion MP of the second sheet member 32; and a joint portion 34C joining the first connection portion 34A and the second connection portion 34B to each other in the X direction.

The second connector member 31 includes a plurality of second contacts 35 attached to the fitting portion FP of the second sheet member 32 and electrically connected to the first connection portions 34A of the second flexible conductors 34. The second contacts 35 are aligned in the Y direction in the fitting portion FP to form a contact row R3 extending in the Y direction.

Each second contact 35 is a donut-shaped conductive member having the same configuration as the first contact 25 of the first connector member 21 and is attached to a peripheral portion of a sheet through hole 32A formed in the second sheet member 32.

The first and second contacts 25 and 35 of donut shape have the same inner diameter.

The second sheet member 32 is made of, for example, insulating cloth, knitted fabric, or rubber material and is a flexible member that is stretchable at least in the X direction, similarly to the first sheet member 22 of the first connector member 21. The second contacts 35 situated in the contact row R3 are displaced when a tensile force in the +X direction is exerted on the distal end of the second sheet member 32 on the +X direction side, and an X-directional shrinking force is generated at the second sheet member 32 elastically stretched in the X direction.

Since the second flexible conductors 34 are made of the embroidery thread, the second flexible conductors 34 extending in the X direction are also configured to be stretchable in the X direction.

As shown in FIG. 5, the base end of the second connector member 31 on the −X direction side is situated on the inner peripheral surface side of the circumferential portion G1 of the garment G. The second connection portions 34B of the second flexible conductors 34 are electrically connected to the corresponding second wiring portions W2 and further to the corresponding electrodes G2 via the second wiring portions W2 on the inner peripheral surface side of the circumferential portion G1.

The distal end of the second connector member 31 on the +X direction side is situated on the outer peripheral surface side of the circumferential portion G1 of the garment G, so that the second contacts 35 are exposed on the outer peripheral surface side of the circumferential portion G1.

Figure 7:
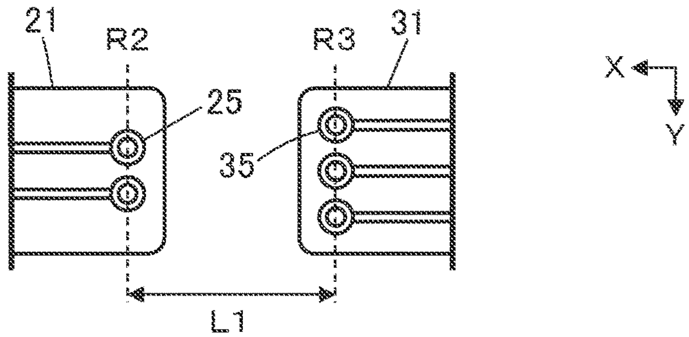
FIG. 7 is a view showing portions of the connector according to Embodiment 1, the portions being exposed on an outer surface of the garment.

In the state where no external force other than gravity acts on the garment G and the connector 11, the contact row R2 of the first connector member 21 and the contact row R3 of the second connector member 31 both exposed on the outer peripheral surface side of the circumferential portion G1 of the garment G are spaced from each other in the X direction by a distance L1, as shown in FIG. 7.

The electrodes G2 attached on the inner peripheral surface of the circumferential portion G1 of the garment G shown in FIG. 1 are used to acquire biological data of the user who is wearing the garment G and can be made of a metal material but may also be formed by weaving-in of a conductive thread; alternatively, use may be made of the electrode G2 having a conductive layer formed by printing or the like on a surface of an insulating resin film.

Fiber wiring formed by weaving-in of a conductive thread may be used for the first wiring portions W1 connecting the second connection portions 24B of the first flexible conductors 24 of the first connector member 21 to the corresponding electrodes G2 and the second wiring portions W2 connecting the second connection portions 34B of the second flexible conductors 34 of the second connector member 31 to the corresponding electrodes G2 on the inner peripheral surface of the circumferential portion G1 of the garment G. Alternatively, wiring having a conductive layer formed by printing or the like on a surface of an insulating resin film may be used for the first wiring portions W1 and the second wiring portions W2.

Figure 8:
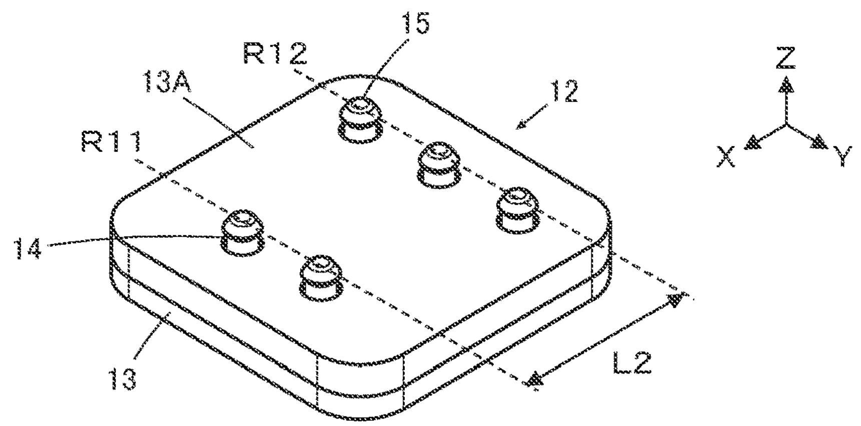
FIG. 8 is a perspective view showing a counter connector used in Embodiment 1.

FIG. 8 shows the counter connector 12 to be fitted to the connector 11. The counter connector 12 includes: an insulating housing 13 having rigidity; and a plurality of counter first contacts 14 and a plurality of counter second contacts 15 both retained by the housing 13. The counter connector 12 is used as a module-side connector.

The housing 13 has a connector opposing surface 13A of flat shape that extends along an XY plane and faces in the +Z direction. The counter first contacts 14 and the counter second contacts 15 protrude in the +Z direction from the connector opposing surface 13A.

The counter first contacts 14 are aligned in the Y direction in a +X directional portion of the housing 13 to form a contact row R11 extending in the Y direction. The counter second contacts 15 are aligned in the Y direction in a −X directional portion of the housing 13 to form a contact row R12 extending in the Y direction at a position spaced from the contact row R11 formed of the counter first contacts 14 in the −X direction by a distance L2.

The distance L2 in the X direction between the contact rows R11 and R12 is set to be shorter than the distance L1 in the X direction between the contact row R2 of the first connector member 21 and the contact row R3 of the second connector member 31 in the state where no external force other than gravity acts on the garment G and the connector 11.

Figure 9:
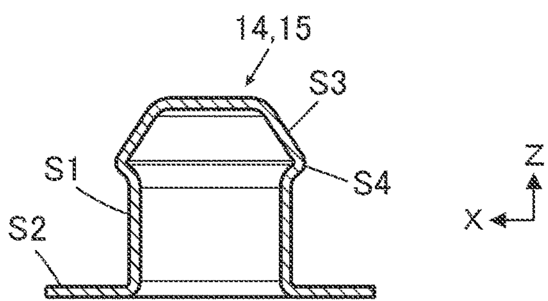
FIG. 9 is a cross-sectional view showing a counter first contact and a counter second contact of the counter connector used in Embodiment 1.

The counter first contacts 14 and the counter second contacts 15 have the same configuration and, as shown in FIG. 9, each include a tubular portion S1 of cylindrical shape extending in the +Z direction and a flange S2 extending along an XY plane from the −Z directional end of the tubular portion S1. The tubular portion S1 is provided at its +Z directional end with a guide portion S3 of conical shape that tapers toward the +Z direction, and the guide portion S3 is provided at its −Z directional end with an overhanging portion S4 of annular shape that protrudes in the radial direction with respect to the tubular portion S1. The outer diameter of the overhanging portion S4 is set to be smaller than the inner diameter of the donut-shaped first contact 25 of the first connector member 21 and the inner diameter of the donut-shaped second contact 35 of the second connector member 31, and the tubular portion S1 and the guide portion S3 are formed to be insertable into the donut-shaped first and second contacts 25 and 35.

When the connector 11 is fitted to the counter connector 12, first, a user puts on the garment G, and the counter connector 12 is positioned between the first connector member 21 and the second connector member 31.

Next, the −X directional end of the first sheet member 22 of the first connector member 21 and the +X directional end of the second sheet member 32 of the second connector member 31 that are exposed on the outer peripheral surface side of the circumferential portion G1 of the garment G are pulled to approach each other, whereby the first sheet member 22 and the second sheet member 32 are stretched in the X direction to the position where the first contacts 25 of the first connector member 21 are situated on the +Z direction side of the counter first contacts 14 of the counter connector 12 and the second contacts 35 of the second connector member 31 are situated on the +Z direction side of the counter second contacts 15 of the counter connector 12.

Figure 10:
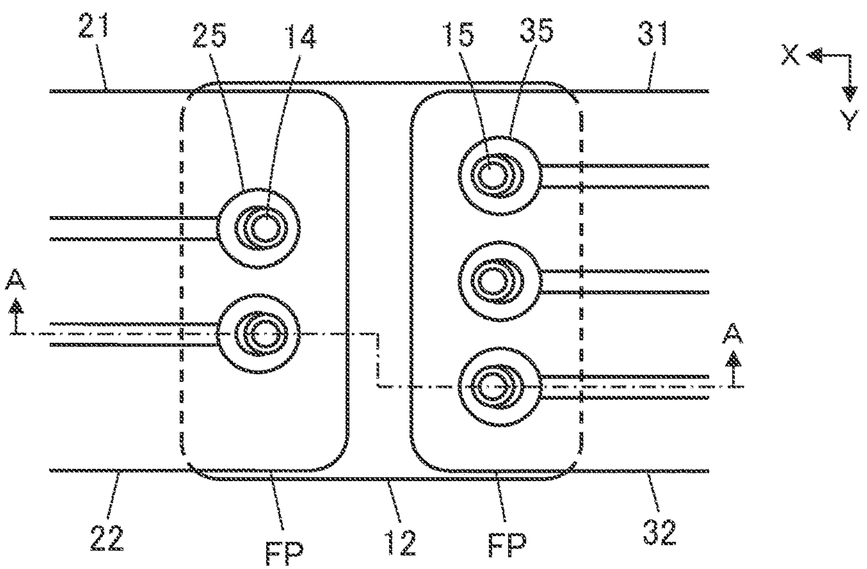
FIG. 10 is a partial plan view showing a fitting state between the connector according to Embodiment 1 and the counter connector.

In this state, the fitting portion FP of the first sheet member 22 of the first connector member 21 and the fitting portion FP of the second sheet member 32 of the second connector member 31 are moved in the −Z direction toward the connector opposing surface 13A of the housing 13 of the counter connector 12 from the +Z direction. Consequently, as shown in FIG. 10, the counter first contacts 14 of the counter connector 12 are separately inserted into and fitted to the corresponding donut-shaped first contacts 25 of the first connector member 21, and the counter second contacts 15 of the counter connector 12 are separately inserted into and fitted to the corresponding donut-shaped second contacts 35 of the second connector member 31.

Then, when X-directional tensile forces acting on the first sheet member 22 of the first connector member 21 and the second sheet member 32 of the second connector member 31 are released, the first sheet member 22 and the second sheet member 32 shrink in the X direction, the first contacts 25 of the first connector member 21 and the second contacts 35 of the second connector member 31 are electrically connected to the counter first contacts 14 and the counter second contacts 15 of the counter connector 12, respectively, and the connector 11 is fitted to the counter connector 12.

Figure 11:
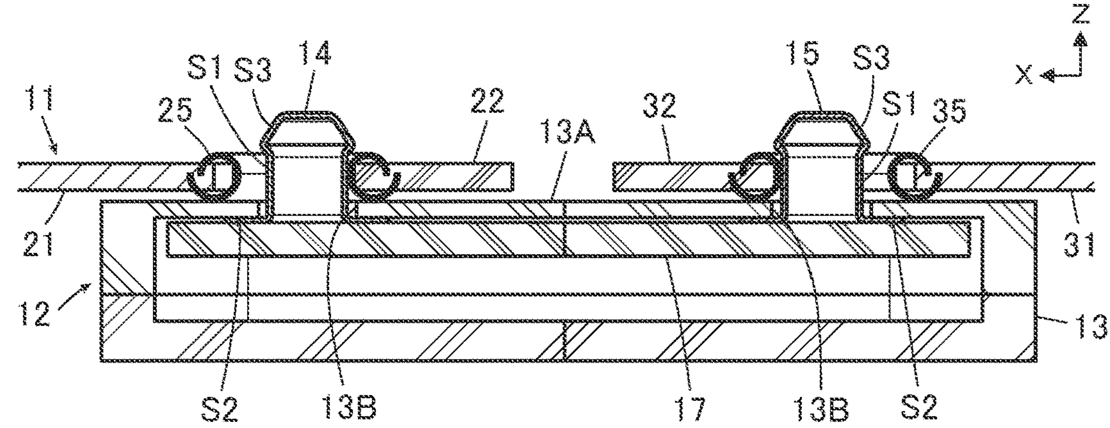
FIG. 11 is a cross-sectional view taken along line A-A in FIG. 10.

FIG. 11 shows the connector 11 and the counter connector 12 thus fitted together. The housing 13 of the counter connector 12 has a module substrate 17 therein, and the flanges S2 of the counter first contacts 14 and the flanges S2 of the counter second contacts 15 are mounted on the module substrate 17.

In the state where the tubular portion S1 and the guide portion S3 of the counter first contact 14 protrude in the +Z direction from the connector opposing surface 13A via a through-hole 13B of the housing 13 and are inserted in the corresponding donut-shaped first contact 25 of the first connector member 21, a shrinking force is generated at the first sheet member 22 due to release of the tensile force acting on the first sheet member 22.

Likewise, in the state where the tubular portion S1 and the guide portion S3 of the counter second contact 15 protrude in the +Z direction from the connector opposing surface 13A via a through-hole 13B of the housing 13 and are inserted in the corresponding donut-shaped second contact 35 of the second connector member 31, a shrinking force is generated at the second sheet member 32 due to release of the tensile force acting on the second sheet member 32.

Consequently, an inner peripheral portion, on the −X direction side, of the first contact 25 of the first connector member 21 makes contact with an outer peripheral portion, on the −X direction side, of the counter first contact 14 of the counter connector 12 at a predetermined contact pressure, and an inner peripheral portion, on the +X direction side, of the second contact 35 of the second connector member 31 makes contact with an outer peripheral portion, on the +X direction side, of the counter second contact 15 of the counter connector 12 at a predetermined contact pressure.

As a result, the first contacts 25 of the first connector member 21 are electrically connected to the counter first contacts 14 of the counter connector 12 separately, and the second contacts 35 of the second connector member 31 are electrically connected to the counter second contacts 15 of the counter connector 12 separately.

As shown in FIG. 2, the second connection portions 24B of the first flexible conductors 24 of the first connector member 21 are electrically connected to the corresponding electrodes G2 via the first wiring portions W1 of the garment G, separately.

Likewise, as shown in FIG. 5, the second connection portions 34B of the second flexible conductors 34 of the second connector member 31 are electrically connected to the corresponding electrodes G2 via the second wiring portions W2 of the garment G, separately.

Therefore, it is possible to, via the first contacts 25 and the second contacts 35 of the connector 11, electrically connect the counter first contacts 14 and the counter second contacts 15 of the counter connector 12 separately to the electrodes G2 disposed on the inner peripheral surface side of the circumferential portion G1 of the garment G.

Hence, by mounting a predetermined electronic circuit on the module substrate 17 housed in the counter connector 12, the user's biological data acquired through the electrodes G2 can be measured by the electronic circuit or transmitted from the electronic circuit to a remote measurement device.

Since the distance L2 in the X direction between the contact rows R11 and R12 of the counter connector 12 is set to be shorter than the distance L1 in the X direction between the contact row R2 of the first connector member 21 and the contact row R3 of the second connector member 31 with no external force other than gravity acting on the garment G and the connector 11, the first sheet member 22 and the second sheet member 32 are each in a state of being stretched in the X direction in the connector 11 fitted to the counter connector 12.

Figure 12:
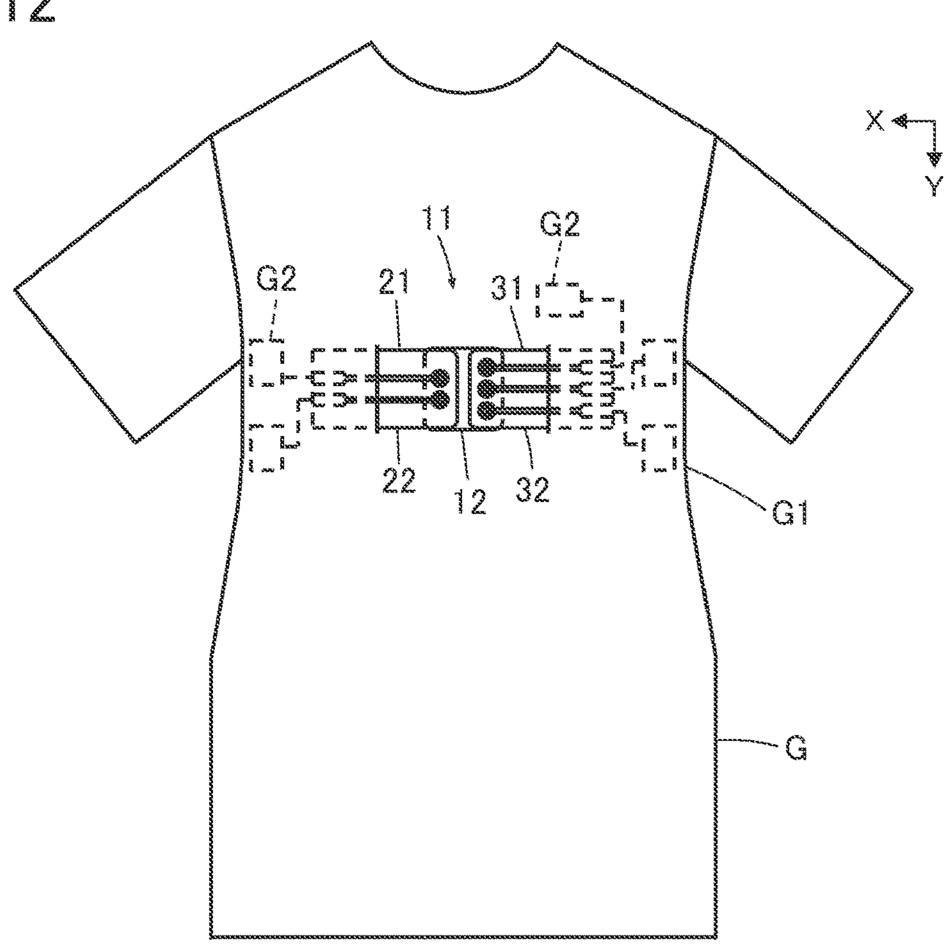
FIG. 12 is a view showing the garment with the connector according to Embodiment 1 being mounted thereon and fitted with the counter connector.

Accordingly, X-directional shrinking forces act on the first sheet member 22 and the second sheet member 32, and this tightens the circumferential portion G1 of the garment G to which the first connector member 21 and the second connector member 31 are attached, thus making the circumferential length of the circumferential portion G1 shorter as shown in FIG. 12.

This configuration makes it possible to cause the electrodes G2 disposed on the inner peripheral surface side of the circumferential portion G1 of the garment G to be closely attached to the body of the user who is wearing the garment G.

Thus, it is possible to carry out both establishment of electric connection of the electrodes G2 attached to the garment G to the counter first contacts 14 and the counter second contacts 15 of the counter connector 12 and tightening of the garment G only by mounting the connector 11 according to Embodiment 1 on the garment G and fitting the counter connector 12 to the connector 11. In other words, it is possible to acquire biological data of the user who is wearing the garment G with high accuracy and perform electric processing by use of the counter connector 12 that is the module-side connector.

When acquisition of the user's biological data is not carried out, the counter connector 12 may be detached from the garment G to release the fitting between the connector 11 and the counter connector 12, whereby the garment G returns to the initial condition shown in FIG. 1, which is loose clothes without a feel of tightness.

In Embodiment 1 above, the second connection portions 24B of the first flexible conductors 24 of the first sheet member 22 and the second connection portions 34B of the second flexible conductors 34 of the second sheet member 32 are electrically connected to the corresponding first and second wiring portions W1 and W2 on the inner peripheral surface side of the circumferential portion G1 of the garment G, respectively; however, the invention is not limited thereto.

For example, the second connection portions 24B of the first flexible conductors 24 of the first sheet member 22 and the second connection portions 34B of the second flexible conductors 34 of the second sheet member 32 may be disposed on the outer peripheral surface side of the circumferential portion G1 of the garment G and electrically connected to the corresponding first and second wiring portions W1 and W2 disposed on the inner peripheral surface side of the circumferential portion G1 by sewing with a conductive thread. This configuration eliminates the need of the slits G3 and G4 formed in the circumferential portion G1 of the garment G.

Embodiment 2

In the connector 11 according to Embodiment 1, only by mounting the connector 11 on the garment G and fitting the same to the counter connector 12, contact forces are imparted between the first contacts 25 and the counter first contacts 14 of the counter connector 12 and between the second contacts 35 and the counter second contacts 15 of the counter connector 12, and also a tightening force is imparted to the circumferential portion G1 of the garment G. In this respect, the contact forces and tightening force imparted can be configured to be adjustable.

Figure 13:
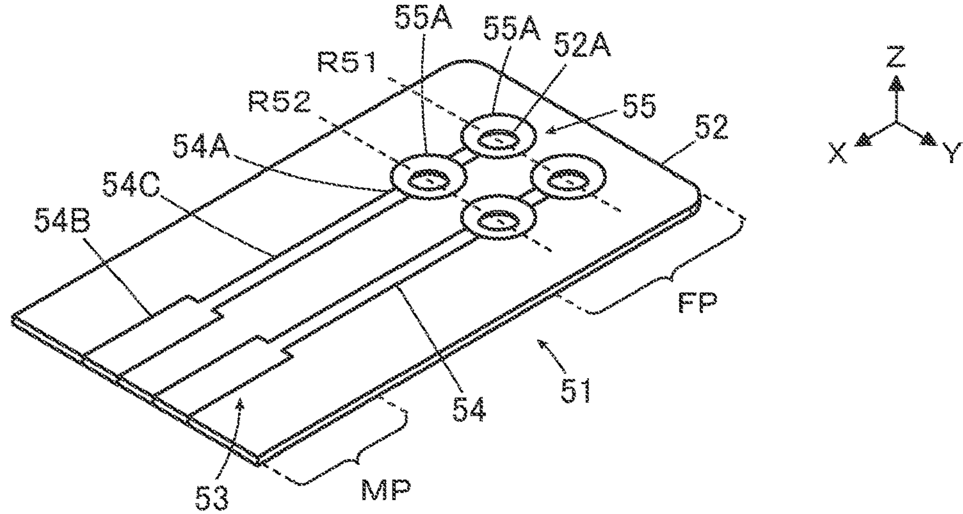
FIG. 13 is a perspective view showing a first connector member used in Embodiment 2.

FIG. 13 shows a first connector member 51 used in a connector 41 according to Embodiment 2. The first connector member 51 includes an insulating first sheet member 52 extending along an XY plane. The first sheet member 52 includes: a mounting portion MP defined at a base end of the first sheet member 52 on the +X direction side; and a fitting portion FP defined at a distal end of the first sheet member 52 on the −X direction side.

The first sheet member 52 is provided with an embroidery pattern 53 made by sewing an embroidery thread, and a conductive thread is used as the embroidery thread forming the embroidery pattern 53, so that a plurality of first flexible conductors 54 having electric conductivity are formed. Each first flexible conductor 54 includes a first connection portion 54A disposed in the fitting portion FP of the first sheet member 52, a second connection portion 54B disposed in the mounting portion MP of the first sheet member 52, and a joint portion 54C joining the first connection portion 54A and the second connection portion 54B to each other, as with the first flexible conductor 24 in Embodiment 1.

The first connector member 51 includes a plurality of first contacts 55 that correspond to the first flexible conductors 54 and that are attached to the fitting portion FP of the first sheet member 52. Each first contact 55 includes two first contact parts 55A aligned at an interval along the X direction, and those two first contact parts 55A are both electrically connected to the first connection portion 54A of the corresponding first flexible conductor 54.

The first contact parts 55A disposed on the −X direction side in the first contacts 55 form a first contact row R51 aligned in the Y direction and extending in the Y direction, and the first contact parts 55A disposed on the +X direction side in the first contacts 55 form a second contact row R52 aligned in the Y direction and extending in the Y direction.

Figure 14:
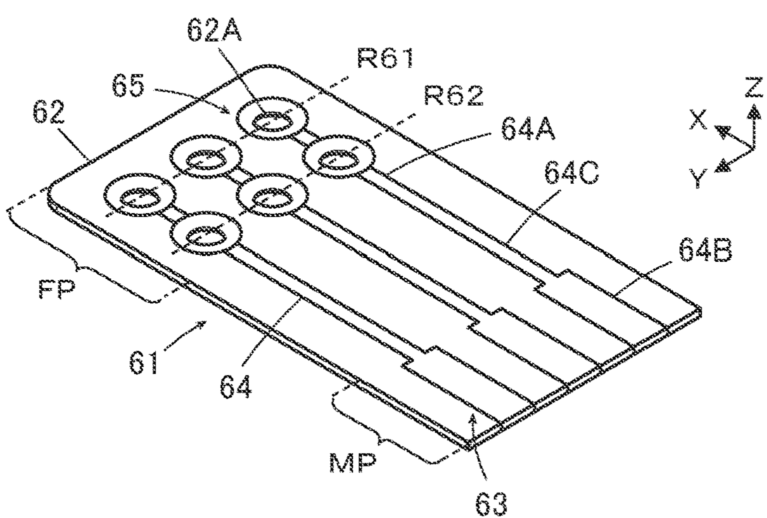
FIG. 14 is a perspective view showing a second connector member used in Embodiment 2.

FIG. 14 shows a second connector member 61 used in the connector 41 according to Embodiment 2. The second connector member 61 includes an insulating second sheet member 62 extending along an XY plane. The second sheet member 62 includes: a mounting portion MP defined at a base end of the second sheet member 62 on the −X direction side; and a fitting portion FP defined at a distal end of the second sheet member 62 on the +X direction side.

The second sheet member 62 is provided with an embroidery pattern 63 made by sewing an embroidery thread, and a conductive thread is used as the embroidery thread forming the embroidery pattern 63, so that a plurality of second flexible conductors 64 having electric conductivity are formed. Each second flexible conductor 64 includes a first connection portion 64A disposed in the fitting portion FP of the second sheet member 62, a second connection portion 64B disposed in the mounting portion MP of the second sheet member 62, and a joint portion 64C joining the first connection portion 64A and the second connection portion 64B to each other, as with the second flexible conductor 34 in Embodiment 1.

The second connector member 61 includes a plurality of second contacts 65 that correspond to the second flexible conductors 64 and that are attached to the fitting portion FP of the second sheet member 62. Each second contact 65 includes two second contact parts 65A aligned at an interval along the X direction, and those two second contact parts 65A are both electrically connected to the first connection portion 64A of the corresponding second flexible conductor 64.

The second contact parts 65A disposed on the +X direction side in the second contacts 65 form a first contact row R61 aligned in the Y direction and extending in the Y direction, and the second contact parts 65A disposed on the −X direction side in the second contacts 65 form a second contact row R62 aligned in the Y direction and extending in the Y direction.

The first sheet member 52 and the second sheet member 62 are made of, for example, insulating cloth, knitted fabric, or rubber material and are flexible members stretchable at least in the X direction, as with the first and second sheet members 22 and 32 in Embodiment 1.

The two first contact parts 55A of each first contact 55 and the two second contact parts 65A of each second contact 65 are conductive members having a ring shape, more specifically, a donut shape, made of metal or the like, and may be formed of a ring-shaped metal fitting called a grommet for instance, similarly to the first contact 25 and the second contact 35 in Embodiment 1.

The first contact part 55A is attached to a peripheral portion of a sheet through hole 52A that is formed in the first sheet member 52 in a place where the first connection portion 54A of the corresponding first flexible conductor 54 is situated, and the second contact part 65A is attached to a peripheral portion of a sheet through hole 62A that is formed in the second sheet member 62 in a place where the first connection portion 64A of the corresponding second flexible conductor 64 is situated.

Figure 15:
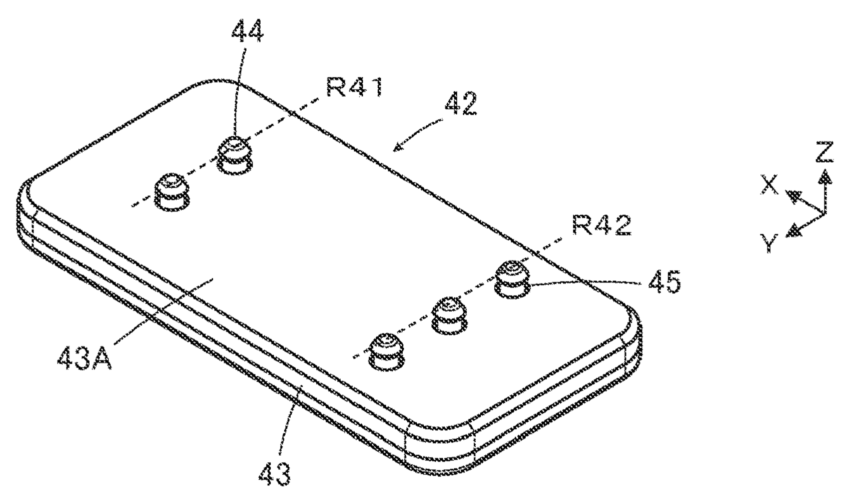
FIG. 15 is a perspective view showing a counter connector used in Embodiment 2.

FIG. 15 shows a counter connector 42 to be fitted to the connector 41. The counter connector 42 has the same structure as the counter connector 12 in Embodiment 1 except for its shape elongated in the X direction. Specifically, the counter connector 42 includes: an insulating housing 43 having rigidity; and a plurality of counter first contacts 44 and a plurality of counter second contacts 45 protruding in the +Z direction from a connector opposing surface 43A of the housing 43, the connector opposing surface 43A extending along an XY plane and facing the +Z direction.

The counter first contacts 44 are aligned in the Y direction in a +X directional portion of the housing 43 to form a contact row R41 extending in the Y direction, and the counter second contacts 45 are aligned in the Y direction in a −X directional portion of the housing 43 to form a contact row R42 extending in the Y direction.

The counter first contacts 44 and the counter second contacts 45 have the same structure as the counter first contacts 14 and the counter second contacts 15 used in Embodiment 1 and shown in FIG. 9.

Also in the connector 41 according to Embodiment 2, the first sheet member 52 of the first connector member 51 and the second sheet member 62 of the second connector member 61 are stretched in the X direction, and in this state, the counter first contacts 44 of the counter connector 42 are fitted to the first contacts 55 of the first connector member 51, while the counter second contacts 45 of the counter connector 42 are fitted to the second contacts 65 of the second connector member 61, as with the connector 11 of Embodiment 1.

Subsequently, X-directional tensile forces acting on the first sheet member 52 of the first connector member 51 and the second sheet member 62 of the second connector member 61 are released, whereupon the counter connector 42 is fitted to the connector 41.

In the meantime, the first contacts 55 of the first connector member 51 each have the two first contact parts 55A aligned at an interval along the X direction, so that the first contact row R51 and the second contact row R52 are formed. Therefore, a shrinking force generated at the first sheet member 52 when the connector 41 is fitted to the counter connector 42 varies depending on, into the first contact parts 55A of which row, the first contact row R51 or the second contact row R52, the counter first contacts 44 of the counter connector 42 are inserted.

Likewise, the second contacts 65 of the second connector member 61 each have the two second contact parts 65A aligned at an interval along the X direction, so that the first contact row R61 and the second contact row R62 are formed. Therefore, a shrinking force generated at the second sheet member 62 when the connector 41 is fitted to the counter connector 42 varies depending on, into the second contact parts 65A of which row, the first contact row R61 or the second contact row R62, the counter second contacts 45 of the counter connector 42 are inserted.

Figure 16:
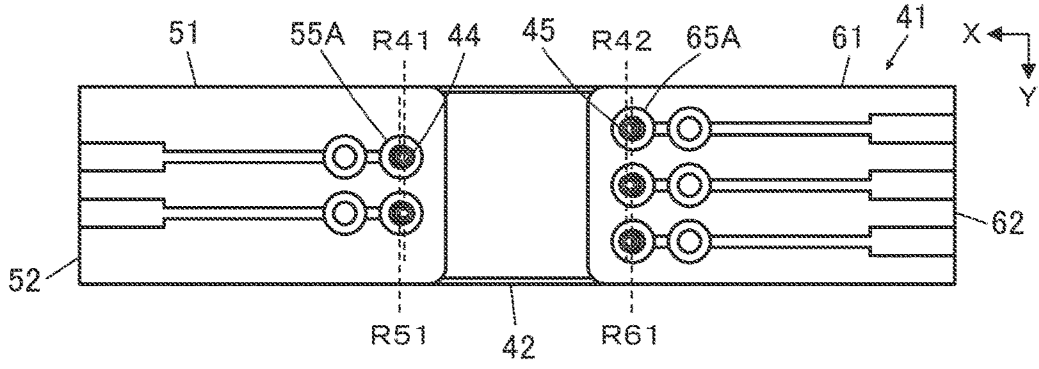
FIG. 16 is a plan view showing a first fitting state between a connector and the counter connector in Embodiment 2.

For instance, the counter connector 42 can be fitted to the connector 41 by fitting the counter first contacts 44 forming the contact row R41 of the counter connector 42 to the first contact parts 55A forming the first contact row R51 of the first connector member 51 and fitting the counter second contacts 45 forming the contact row R42 of the counter connector 42 to the second contact parts 65A forming the first contact row R61 of the second connector member 61, as shown in FIG. 16.

In this case, the X-directional stretching amounts of the first sheet member 52 and the second sheet member 62 are relatively small, and hence, the shrinking forces generated at the first sheet member 52 and the second sheet member 62 are relatively weak. As a consequence, the first contact parts 55A and the second contact parts 65A make contact with the counter first contacts 44 and the counter second contacts 45 with relatively weak forces, respectively, so that a relatively weak tightening force acts on the circumferential portion G1 of the garment G.

Figure 17:
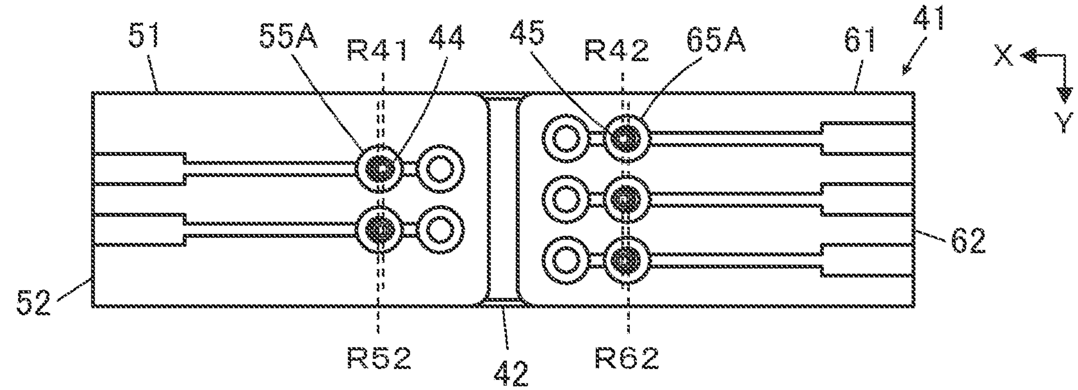
FIG. 17 is a plan view showing a second fitting state between the connector and the counter connector in Embodiment 2.

On the other hand, the counter connector 42 can be fitted to the connector 41 also by, for example, fitting the counter first contacts 44 forming the contact row R41 of the counter connector 42 to the first contact parts 55A forming the second contact row R52 of the first connector member 51 and fitting the counter second contacts 45 forming the contact row R42 of the counter connector 42 to the second contact parts 65A forming the second contact row R62 of the second connector member 61, as shown in FIG. 17.

In this case, the X-directional stretching amounts of the first sheet member 52*b* and the second sheet member 62 are relatively large, and hence, the shrinking forces generated at the first sheet member 52 and the second sheet member 62 are relatively strong. As a consequence, the first contact parts 55A and the second contact parts 65A make contact with the counter first contacts 44 and the counter second contacts 45 with relatively strong forces, respectively, so that a relatively strong tightening force acts on the circumferential portion G1 of the garment G.

Thus, one of the first contact row R51 and the second contact row R52 of the first connector member 51 and one of the first contact row R61 and the second contact row R62 of the second connector member 61 are selected depending on the body frame of the user who wears the garment G, and then the counter connector 42 is fitted to the connector 41, thus adjusting the contact forces and tightening force imparted.

In Embodiment 2 above, the first connector member 51 has the first contact row R51 and the second contact row R52, and the second connector member 61 has the first contact row R61 and the second contact row R62; however, each of the first and second connector members 51 and 61 may have three or more contact rows.

The number of contact rows of the first connector member 51 may be the same as or different from the number of contact rows of the second connector member 61.

Embodiment 3

In Embodiment 1, the counter connector 12 is fitted to the connector 11 in the state where the housing 13 of the counter connector 12 is disposed on the −Z direction side of the −X directional portion of the first sheet member 22 where the first contacts 25 are exposed and the +X directional portion of the second sheet member 32 where the second contacts 35 are exposed, that is, disposed on the side closer to the garment G, as shown in FIGS. 10 and 11; however, the invention is not limited thereto.

Figure 18:
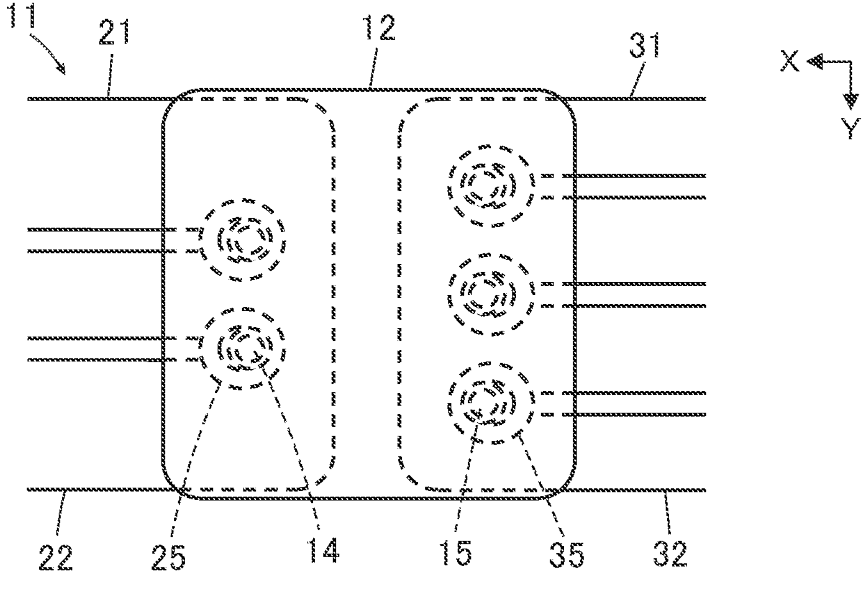
FIG. 18 is a partial plan view showing a fitting state between a connector and a counter connector in Embodiment 3.

For instance, as shown in FIG. 18, the counter connector 12 may be disposed on the +Z direction side of the −X directional portion of the first sheet member 22 and the +X directional portion of the second sheet member 32, that is, on the opposite side from the garment G, to fit the counter connector 12 to the connector 11.

It should be noted that, in this case, the counter connector 12 is fitted to the connector 11 from the +Z direction with its position being turned over in the Z direction such that the counter first contacts 14 and the counter second contacts 15 protrude in the −Z direction.

Embodiment 4

In Embodiment 1, the first contacts 25 are retained by the stretchable first sheet member 22 of the first connector member 21, and the second contacts 35 are retained by the stretchable second sheet member 32 of the second connector member 31; however, the invention is not limited thereto.

Figure 19:
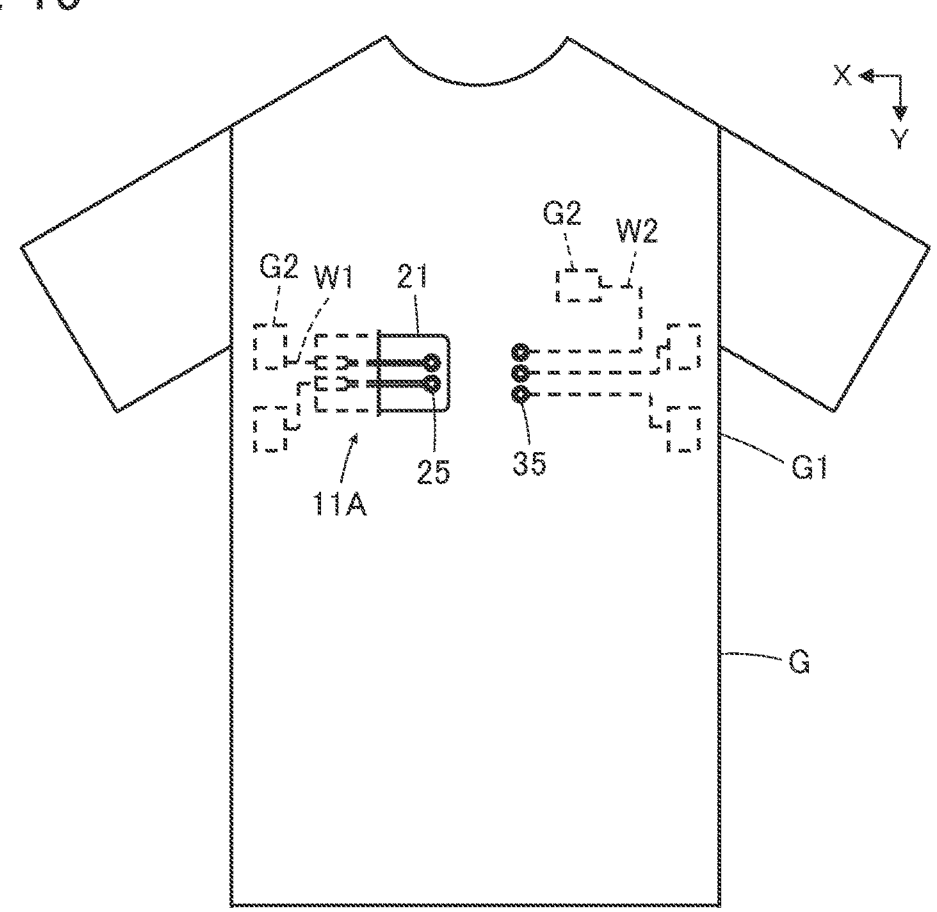
FIG. 19 is a view showing a garment on which a connector according to Embodiment 4 is mounted.

FIG. 19 shows a garment G on which a connector 11A according to Embodiment 4 is attached. The garment G is the same as that used in Embodiment 1. The electrodes G2 and the first and second wiring portions W1 and W2 are disposed on the inner peripheral surface of the tubular circumferential portion G1.

The connector 11A is a connector corresponding to the connector 11 according to Embodiment 1 but, of the first and second connector members 21 and 31, the second connector member 31 is omitted, and the second contacts 35 are retained on the circumferential portion G1 of the garment G.

The second contacts 35 are directly connected to the second wiring portions W2 on the inner peripheral surface side of the circumferential portion G1 of the garment G.

Figure 20:
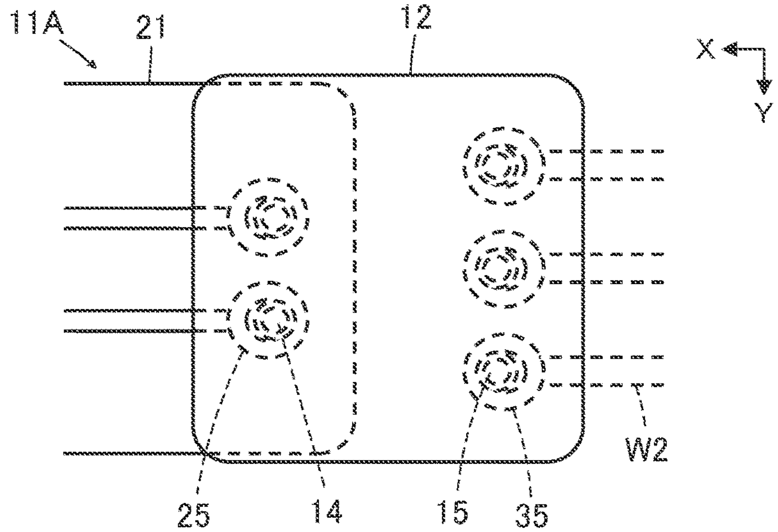
FIG. 20 is a partial plan view showing a fitting state between the connector and a counter connector in Embodiment 4.

In the connector 11A of Embodiment 4, the first sheet member 22 is stretched in the X direction by pulling the −X directional end of the first sheet member 22 of the first connector member 21 in the −X direction, and in this state, the counter first contacts 14 of the counter connector 12 are fitted to the first contacts 25 of the first connector member 21, while the counter second contacts 15 of the counter connector 12 are fitted to the second contacts 35 retained on the circumferential portion G1 of the garment G, as shown in FIG. 20.

Subsequently, an X-directional tensile force acting on the first sheet member 22 of the first connector member 21 is released, whereupon the counter connector 12 is fitted to the connector 11A.

Even when the second contacts 35 are retained by the garment G, a shrinking force is generated at the first sheet member 22 stretched in the X direction, and this makes it possible to bring the first contacts 25 and the second contacts 35 into contact with the counter first contacts 14 and the counter second contacts 15 of the counter connector 12 at a predetermined contact pressure, respectively, and to allow a tightening force to act on the circumferential portion G1 of the garment G where the connector 11A is disposed.

It should be noted that, of the first and second connector members 21 and 31 in Embodiment 1, the first connector member 21 may be omitted with the first contacts 25 being retained on the circumferential portion G1 of the garment G. In this case, the counter first contacts 14 of the counter connector 12 are inserted into the first contacts 25 retained on the circumferential portion G1 of the garment G, and the counter second contacts 15 of the counter connector 12 are inserted into the second contacts 35 of the second connector member 31.

In Embodiments 1 to 4 above, the first contacts 25, the second contacts 35, the first contact parts 55A of the first contacts 55, and the second contact parts 65A of the second contacts 65 all have a so-called donut shape; however, the shape is not limited to a donut shape, and for example, a conductive member of flat plate and ring shape made of metal or the like may also be used.

Embodiment 5

Figure 21:
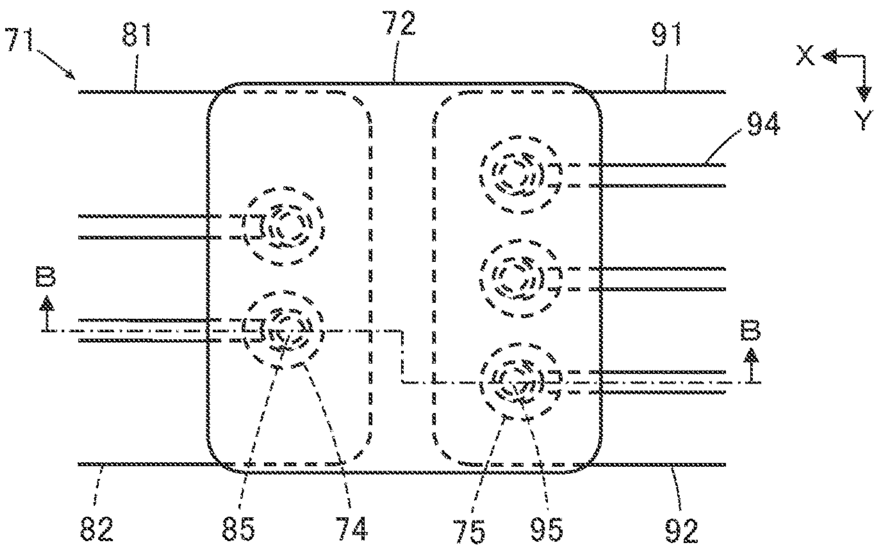
FIG. 21 is a partial plan view showing a fitting state between a connector and a counter connector in Embodiment 5.

FIG. 21 shows a fitting state between a connector 71 according to Embodiment 5 and a counter connector 72. The connector 71 includes a first connector member 81 having a plurality of first contacts 85 protruding in the +Z direction and a second connector member 91 having a plurality of second contacts 95 protruding in the +Z direction.

The first connector member 81 has an insulating first sheet member 82 extending in an XY plane, and the first sheet member 82 is provided with a plurality of first flexible conductors 84 formed using a conductive thread. The first contacts 85 are retained by the first sheet member 82 and connected to the first flexible conductors 84.

The second connector member 91 has an insulating second sheet member 92 extending in an XY plane, and the second sheet member 92 is provided with a plurality of second flexible conductors 94 formed using a conductive thread. The second contacts 95 are retained by the second sheet member 92 and connected to the second flexible conductors 94.

The first sheet member 82 and the second sheet member 92 are made of, for example, insulating cloth, knitted fabric, or rubber material and are flexible members stretchable at least in the X direction, as with the first and second sheet members 22 and 32 in Embodiment 1.

Figure 22:
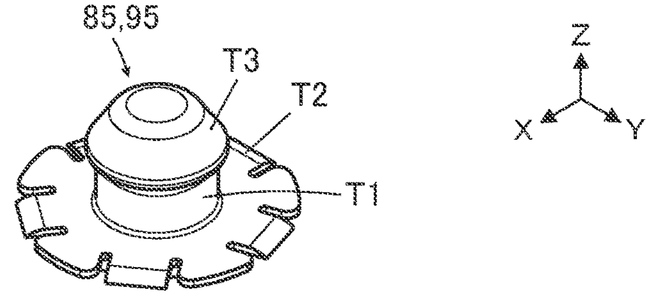
FIG. 22 is a perspective view showing a first contact and a second contact used in Embodiment 5.

The first contacts 85 and the second contacts 95 each include a tubular portion T1 of cylindrical shape extending in the +Z direction and a flange T2 extending along an XY plane from the −Z directional end of the tubular portion T1, as shown in FIG. 22. The first contacts 85 and the second contacts 95 are retained by the first sheet member 82 and the second sheet member 92 by partially inserting their flanges T2 through the first sheet member 82 and the second sheet member 92 and bending the inserted parts to the −Z direction side, and are thereby electrically connected to the corresponding first flexible conductors 84 and the corresponding second flexible conductors 94, respectively.

The tubular portion T1 is provided at its +Z directional end with a guide portion T3 of conical shape that tapers toward the +Z direction.

Figure 23:
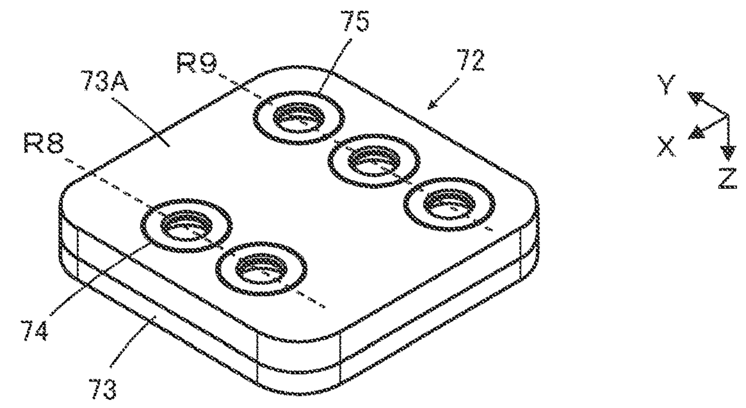
FIG. 23 is a perspective view showing the counter connector used in Embodiment 5.

As shown in FIG. 23, the counter connector 72 includes: an insulating housing 73 having rigidity; and a plurality of counter first contacts 74 and a plurality of counter second contacts 75 both retained by the housing 73.

The housing 73 has a connector opposing surface 73A of flat shape that extends along an XY plane and faces in the −Z direction. The counter first contacts 74 and the counter second contacts 75 are retained by the housing 73 so as to be exposed in the −Z direction from the connector opposing surface 73A.

The counter first contacts 74 are aligned in the Y direction in a +X directional portion of the housing 73 to form a contact row R8 extending in the Y direction, and the counter second contacts 75 are aligned in the Y direction in a −X directional portion of the housing 73 to form a contact row R9 extending in the Y direction.

The counter first contacts 74 and the counter second contacts 75 are conductive members of flat ring shape made of metal or the like. Each of the counter first contacts 74 and the counter second contacts 75 is provided at its center with an insertion hole that allows insertion of the tubular portion T1 and the guide portion T3 of the corresponding one of the first contacts 85 and the second contacts 95.

When the connector 71 is fitted to the counter connector 72, first, the −X directional end of the first sheet member 82 of the first connector member 81 and the +X directional end of the second sheet member 92 of the second connector member 91 are pulled to approach each other, whereby the first sheet member 82 and the second sheet member 92 are stretched in the X direction, as with Embodiment 1.

In this state, the tubular portions T1 and the guide portions T3 of the first contacts 85 of the first connector member 81 are inserted into the ring-shaped counter first contacts 74 of the counter connector 72, and the tubular portions T1 and the guide portions T3 of the second contacts 95 of the second connector member 91 are inserted into the ring-shaped counter second contacts 75 of the counter connector 72.

Then, when X-directional tensile forces acting on the first sheet member 82 of the first connector member 81 and the second sheet member 92 of the second connector member 91 are released, the first sheet member 82 and the second sheet member 92 shrink in the X direction, the first contacts 85 of the first connector member 81 and the second contacts 95 of the second connector member 91 are electrically connected to the counter first contacts 74 and the counter second contacts 75 of the counter connector 72, respectively, and the connector 71 is fitted to the counter connector 72.

Figure 24:
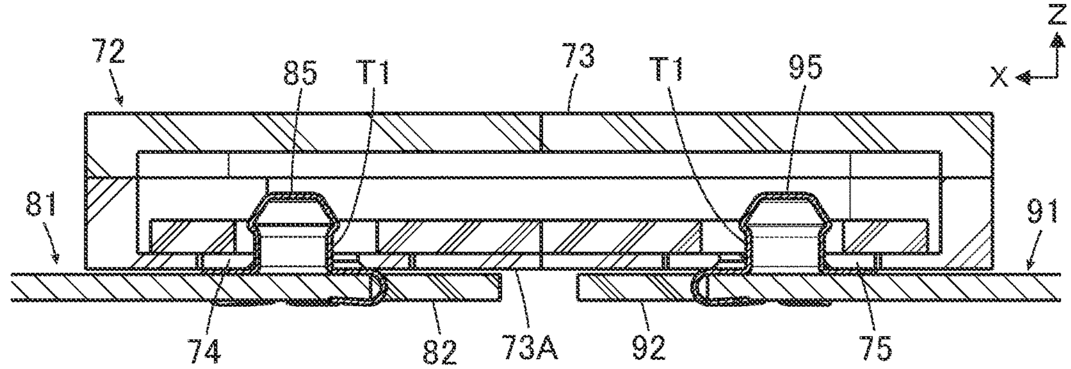
FIG. 24 is a cross-sectional view taken along line B-B in FIG. 21.
Figure 25:
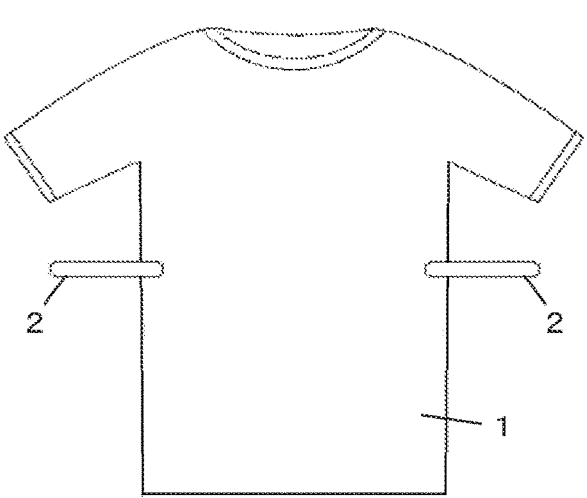
FIG. 25 is a front view showing a garment to which a conventional tightening device is attached.
Figure 26:
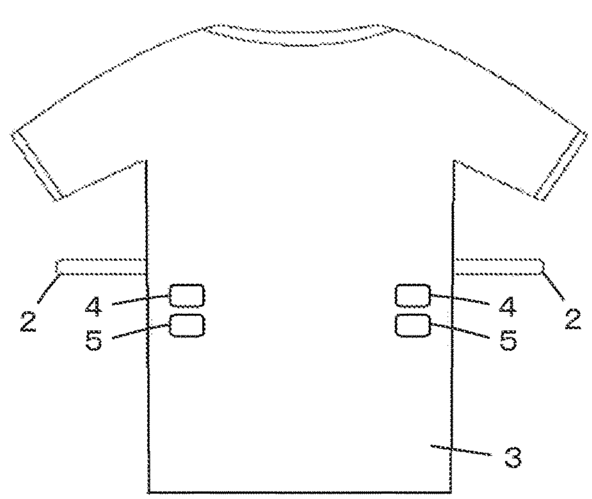
FIG. 26 is a back view showing the garment to which the conventional tightening device is attached.

FIG. 24 shows the connector 71 and the counter connector 72 thus fitted together. Upon shrinking of the first and second sheet members 82 and 92 in the X direction, an outer peripheral portion, on the +X direction side, of the tubular portion T1 of the first contact 85 of the first connector member 81 makes contact with an inner peripheral portion, on the +X direction side, of the ring-shaped counter first contact 74 of the counter connector 72 at a predetermined contact pressure, and an outer peripheral portion, on the −X direction side, of the tubular portion T1 of the second contact 95 of the second connector member 91 makes contact with an inner peripheral portion, on the −X direction side, of the ring-shaped counter second contact 75 of the counter connector 72 at a predetermined contact pressure.

As a result, the first contacts 85 of the first connector member 81 and the second contacts 95 of the second connector member 91 can be electrically connected to the counter first contacts 74 and the counter second contacts 75 of the counter connector 72, respectively.

In addition, upon shrinking of the first and second sheet members 82 and 92 in the X direction, a tightening force acts on the circumferential portion G1 of the garment G where the connector 71 is disposed.

Thus, even when the first contacts 85 and the second contacts 95 that protrude in the +Z direction are attached to the stretchable first sheet member 82 of the first connector member 81 and the stretchable second sheet member 92 of the second connector member 91, respectively, and the ring-shaped counter first contacts 74 and the ring-shaped counter second contacts 75 are disposed in the rigid housing 73 of the counter connector 72, the same effects as those of the connector 11 of Embodiment 1 can be obtained.

In Embodiments 1 to 5 above, the number of the first contacts 25, 55, 85 and the number of the second contacts 35, 65, 95 in the connector 11, 11A, 41, 71 as well as the number of the counter first contacts 14, 44, 74 and the number of the counter second contacts 15, 45, 75 in the counter connector 12, 42, 72 are not particularly limited, and it suffices if one or more first contacts and one or more second contacts of the connector are respectively connected to one or more counter first contacts and one or more counter second contacts of the counter connector.

While the electrodes G2 attached on the inner peripheral surface of the circumferential portion G1 of the garment G are, as the terminal member, connected to the connector 11, 11A, 41, 71 in Embodiments 1 to 5 above, various sensors used to acquire user's biological data may serve as the terminal member. Fitting the counter connector 12, 42, 72 to the connector 11, 11A, 41, 71 allows a tightening force to act on the circumferential portion G1 of the garment G, whereby the sensors serving as the terminal member can be closely attached to the user's body, thus acquiring the user's biological data with high accuracy.

While the connector 11, 11A, 41, 71 is mounted on the garment G serving as the mounting object in Embodiments 1 to 5 above, the mounting object is not limited to the garment G, and the connector 11, 11A, 41, 71 may be mounted on various types of mounting objects.

For the mounting object, use may be made of a wearing article having a tubular or ring-shaped circumferential portion into which a part of a user's body is inserted, such as a belly band, a head band, and a wrist band. When the connector 11, 11A, 41, 71 is mounted on such a wearing article, a tightening force can be effectively exerted such that the terminal member attached to the wearing article are closely attached to the user's body. Furthermore, the mounting object may be a shoe worn by a user's foot, and the connector 11, 11A, 41, 71 may be mounted on the shoe to effectively exert a tightening force around the instep of the foot.

What is claimed is:

1. A connector that is configured to be mounted on a mounting object and fitted to a counter connector in which a counter first contact and a counter second contact are retained by a housing having rigidity and an insulating property, the connector comprising:

a first contact and a second contact that are spaced from each other in a predetermined direction and are configured to be respectively fitted to the counter first contact and the counter second contact when the connector is fitted to the counter connector; and a first sheet member that has flexibility and an insulating property and is stretchable at least in the predetermined direction, a base end of the first sheet member in the predetermined direction being mounted on the mounting object at a position opposite from the second contact with respect to the first contact, and a distal end of the first sheet member in the predetermined direction having the first contact retained therein, wherein the second contact is configured to be retained by the mounting object via a second sheet member having flexibility and an insulating property or directly retained by the mounting object, and with at least the first sheet member being elastically stretched in the predetermined direction, the connector is fitted to the counter connector, and due to a shrinking force generated at the first sheet member, the first contact and the second contact are electrically connected to the counter first contact and the counter second contact, respectively.

2. The connector according to claim 1 comprising the second sheet member, wherein the second sheet member is stretchable at least in the predetermined direction, a base end of the second sheet member in the predetermined direction being configured to be mounted on the mounting object at a position opposite from the first contact with respect to the second contact, and a distal end of the second sheet member in the predetermined direction having the second contact retained therein, and with each of the first sheet member and the second sheet member being elastically stretched in the predetermined direction, the connector is fitted to the counter connector, and due to shrinking forces generated at the first sheet member and the second sheet member, the first contact and the second contact are electrically connected to the counter first contact and the counter second contact, respectively.

3. The connector according to claim 1 comprising a first flexible conductor disposed on the first sheet member and is configured to electrically connect the first contact to a first wiring portion of the mounting object.

4. The connector according to claim 2 comprising a second flexible conductor disposed on the second sheet member and is configured to electrically connect the second contact to a second wiring portion of the mounting object.

5. The connector according to claim 1, wherein the first contact includes a plurality of first contact parts aligned at intervals along the predetermined direction and electrically connected to one another, and one of the plurality of first contact parts is selectively fitted to the counter first contact.

6. The connector according to claim 2, wherein the second contact includes a plurality of second contact parts aligned at intervals along the predetermined direction and electrically connected to one another, and one of the plurality of second contact parts is selectively fitted to the counter second contact.

7. The connector according to claim 1, wherein the second contact is configured to be retained by the mounting object and directly connected to a second wiring portion of the mounting object.

8. The connector according to claim 3 comprising a plurality of the first contacts and a plurality of the first flexible conductors both aligned in a direction perpendicular to the predetermined direction, wherein the plurality of the first contacts are electrically connected to a plurality of the counter first contacts of the counter connector, separately.

9. The connector according to claim 4 comprising a plurality of the second contacts and a plurality of the second flexible conductors both aligned in a direction perpendicular to the predetermined direction, wherein the plurality of the second contacts are electrically connected to a plurality of the counter second contacts of the counter connector, separately.

10. The connector according to claim 3, wherein the first sheet member includes a fitting portion disposed in the distal end and overlapping with the counter connector when the connector is fitted to the counter connector, and a mounting portion disposed in the base end and configured to be mounted on the mounting object, the first contact is retained in the fitting portion of the first sheet member, and the first flexible conductor includes a first connection portion disposed in the fitting portion and electrically connected to the first contact, a second connection portion disposed in the mounting portion and configured to be electrically connected to the first wiring portion of the mounting object, and a joint portion joining the first connection portion and the second connection portion to each other.

11. The connector according to claim 4, wherein the second sheet member includes a fitting portion disposed in the distal end and overlapping with the counter connector when the connector is fitted to the counter connector, and a mounting portion disposed in the base end and configured to be mounted on the mounting object, the second contact is retained in the fitting portion of the second sheet member, and the second flexible conductor includes a first connection portion disposed in the fitting portion and electrically connected to the second contact, a second connection portion disposed in the mounting portion and configured to be electrically connected to the second wiring portion of the mounting object, and a joint portion joining the first connection portion and the second connection portion to each other.

12. The connector according to claim 3, wherein the first sheet member is made of cloth, knitted fabric, or a rubber material, and the first flexible conductor is formed of a conductive thread embroidered on or woven into the first sheet member.

13. The connector according to claim 4, wherein the second sheet member is made of cloth, knitted fabric, or a rubber material, and the second flexible conductor is formed of a conductive thread embroidered on or woven into the second sheet member.

14. The connector according to claim 1, wherein the counter first contact and the counter second contact each have a tubular portion of cylindrical shape protruding in the fitting direction, the first contact and the second contact are each formed of a conductive member of ring shape, and an inner peripheral portion of the conductive member makes contact with an outer peripheral portion of the tubular portion corresponding to the conductive member due to the shrinking force generated at the first sheet member.

15. The connector according to claim 1, wherein the first contact and the second contact each have a tubular portion of cylindrical shape protruding in the fitting direction, the counter first contact and the counter second contact are each formed of a conductive member of ring shape, and an outer peripheral portion of the tubular portion makes contact with an inner peripheral portion of the conductive member corresponding to the tubular portion due to the shrinking force generated at the first sheet member.

16. A connector assembly comprising:

the connector according to claim 1; and the counter connector to which the connector is fitted.

17. A wearing article serving as the mounting object on which the connector according to claim 1 is mounted.

18. The wearing article according to claim 17, wherein the wearing article has a circumferential portion of tubular shape or ring shape into which a part of a user's body is inserted, and the connector is mounted on the circumferential portion with taking a circumferential direction of the circumferential portion as the predetermined direction.

19. The wearing article according to claim 18, wherein the wearing article has a slit that allows the first sheet member to be passed therethrough from an inner peripheral surface of the circumferential portion to an outer peripheral surface thereof.

20. The wearing article according to claim 18, wherein the wearing article is provided with a plurality of terminal members disposed on an inner peripheral surface of the circumferential portion and connected to the first contact and the second contact of the connector.

21. The wearing article according to claim 20, wherein each of the plurality of terminal members is constituted of an electrode or a sensor.

* * * * *